(12) United States Patent
Shirakawa

(10) Patent No.: US 8,526,241 B2
(45) Date of Patent: Sep. 3, 2013

(54) NON-VOLATILE SEMICONDUCTOR MEMORY DEVICE CAPABLE OF IMPROVING FAILURE-RELIEF EFFICIENCY

(75) Inventor: Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 13/242,902

(22) Filed: Sep. 23, 2011

(65) Prior Publication Data

US 2012/0182803 A1    Jul. 19, 2012

(30) Foreign Application Priority Data

Jan. 13, 2011   (JP) ................. 2011-004953

(51) Int. Cl.
*G11C 11/34* (2006.01)
*G11C 16/04* (2006.01)
*G11C 16/06* (2006.01)
*G11C 8/00* (2006.01)

(52) U.S. Cl.
USPC ............ 365/185.23; 365/185.11; 365/185.17; 365/189.05; 365/200; 365/230.06

(58) Field of Classification Search
USPC ............. 365/185.11, 185.17, 185.23, 189.05, 365/200, 230.06
See application file for complete search history.

(56) References Cited

U.S. PATENT DOCUMENTS

| | | | |
|---|---|---|---|
| 5,822,256 A * | 10/1998 | Bauer et al. ................. | 365/200 |
| 6,462,985 B2 | 10/2002 | Hosono et al. | |
| 2006/0203596 A1 * | 9/2006 | Shiga ..................... | 365/230.03 |
| 2008/0005530 A1 | 1/2008 | Nakano | |

FOREIGN PATENT DOCUMENTS

| | | |
|---|---|---|
| JP | 4-205798 | 7/1992 |
| JP | 6-119795 | 4/1994 |
| JP | 2002-117692 | 4/2002 |
| JP | 2002-133894 | 5/2002 |
| JP | 2008-9932 | 1/2008 |
| JP | 2009-266280 | 11/2009 |
| JP | 2010-103255 | 5/2010 |
| JP | 2010-118530 | 5/2010 |
| JP | 2011-096341 | 5/2011 |

OTHER PUBLICATIONS

Office Action mailed Jun. 11, 2013, in Japanese Patent Application No. 2011-004953, filed Jan. 13, 2011 (w/English-language Translation), 4 pages.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a non-volatile semiconductor memory device includes a memory cell array and a row decoder. The memory cell array has NAND strings as a physical block, and word lines respectively connected to memory cells included in the NAND strings. The row decoder includes latch circuits and a drive circuit. When a failure exists within a corresponding first logical block, the latch circuits store a flag indicating the failure. The drive circuit inhibits driving of the word lines belonging to the first logical block when the flag is stored in the latch circuit corresponding to the first logical block to which the selected word lines belong, and allows the driving of the word lines belonging to the physical block including the first logical block when the flag is not stored in the latch circuit corresponding to the first logical block to which the selected word lines belong.

17 Claims, 11 Drawing Sheets

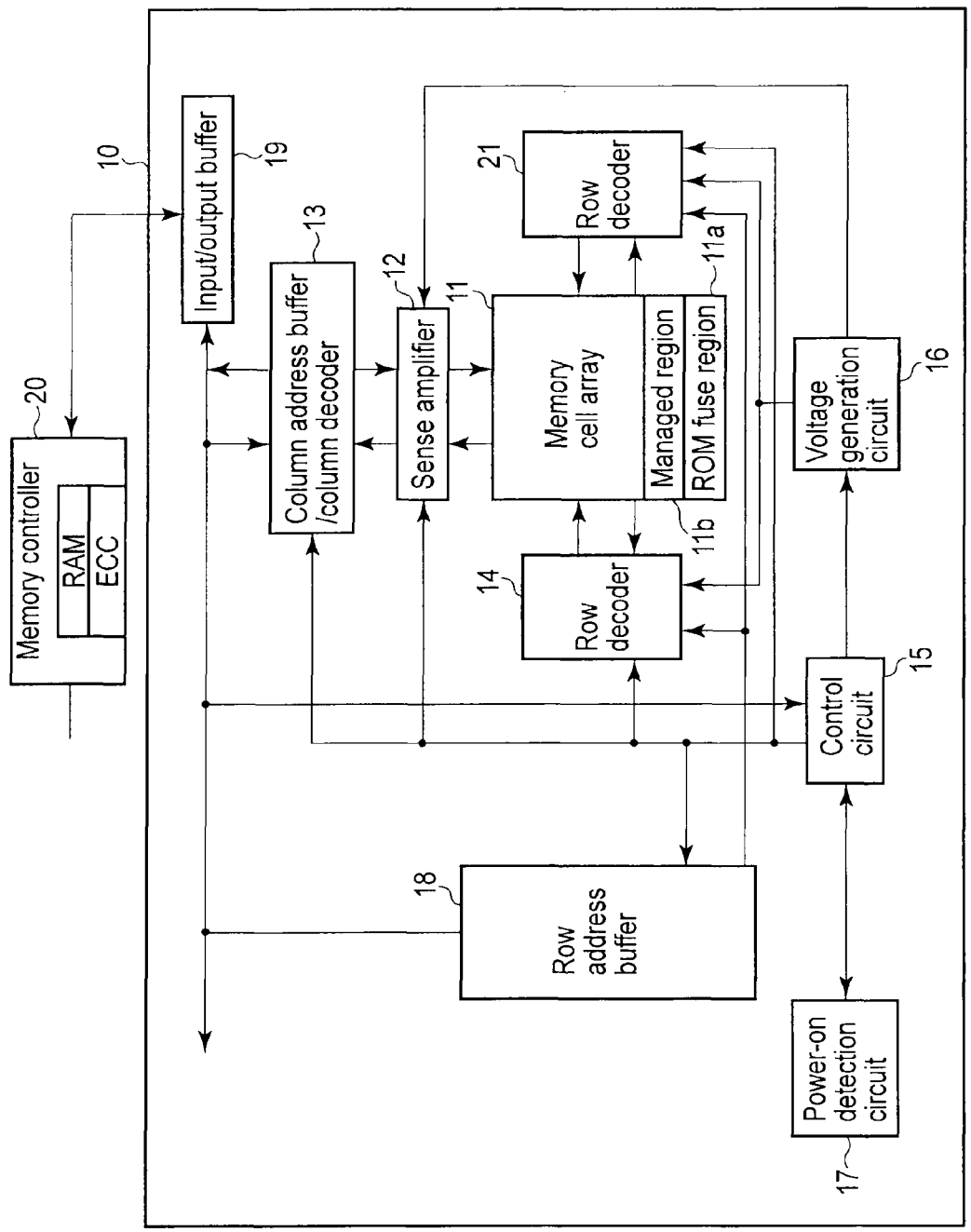
F I G. 1

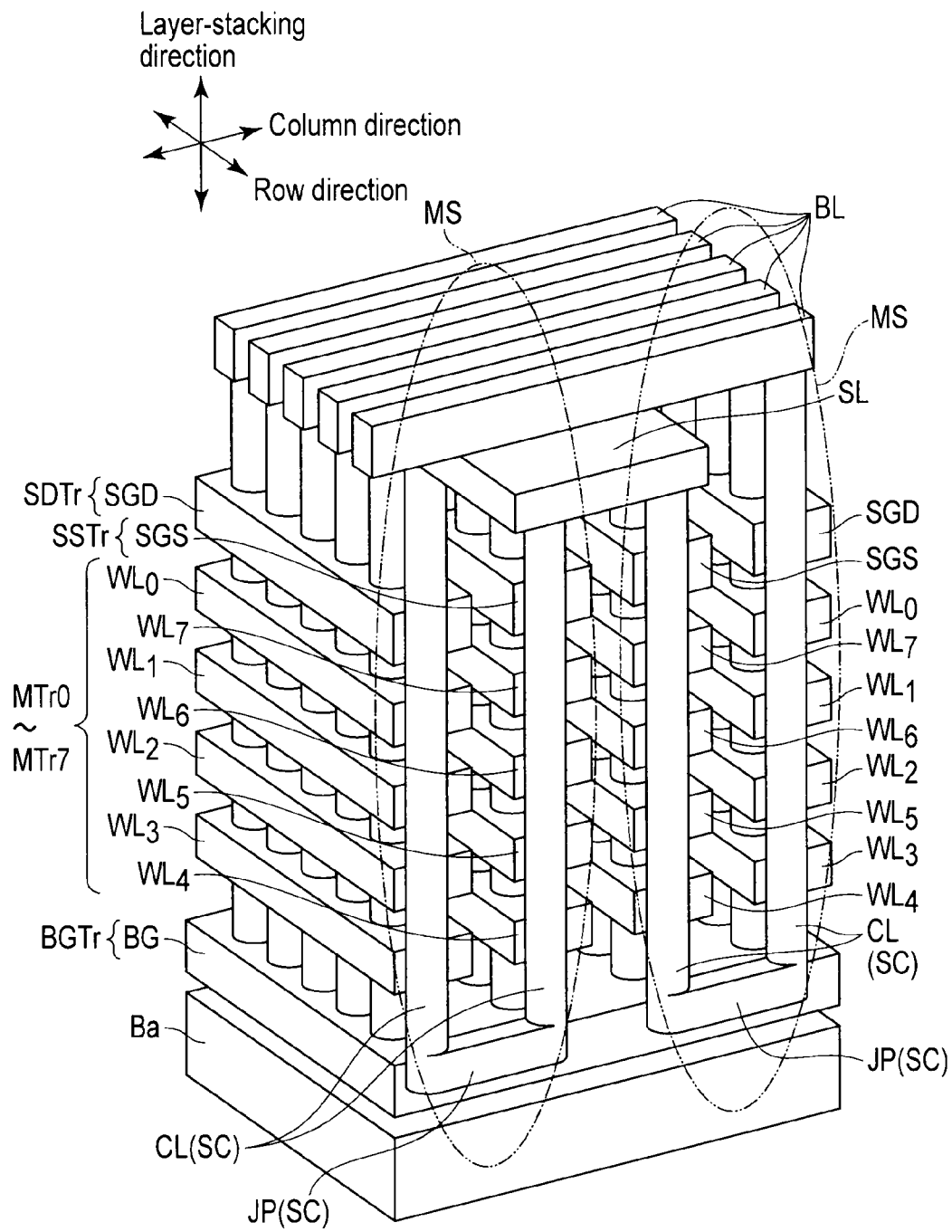
F I G. 2

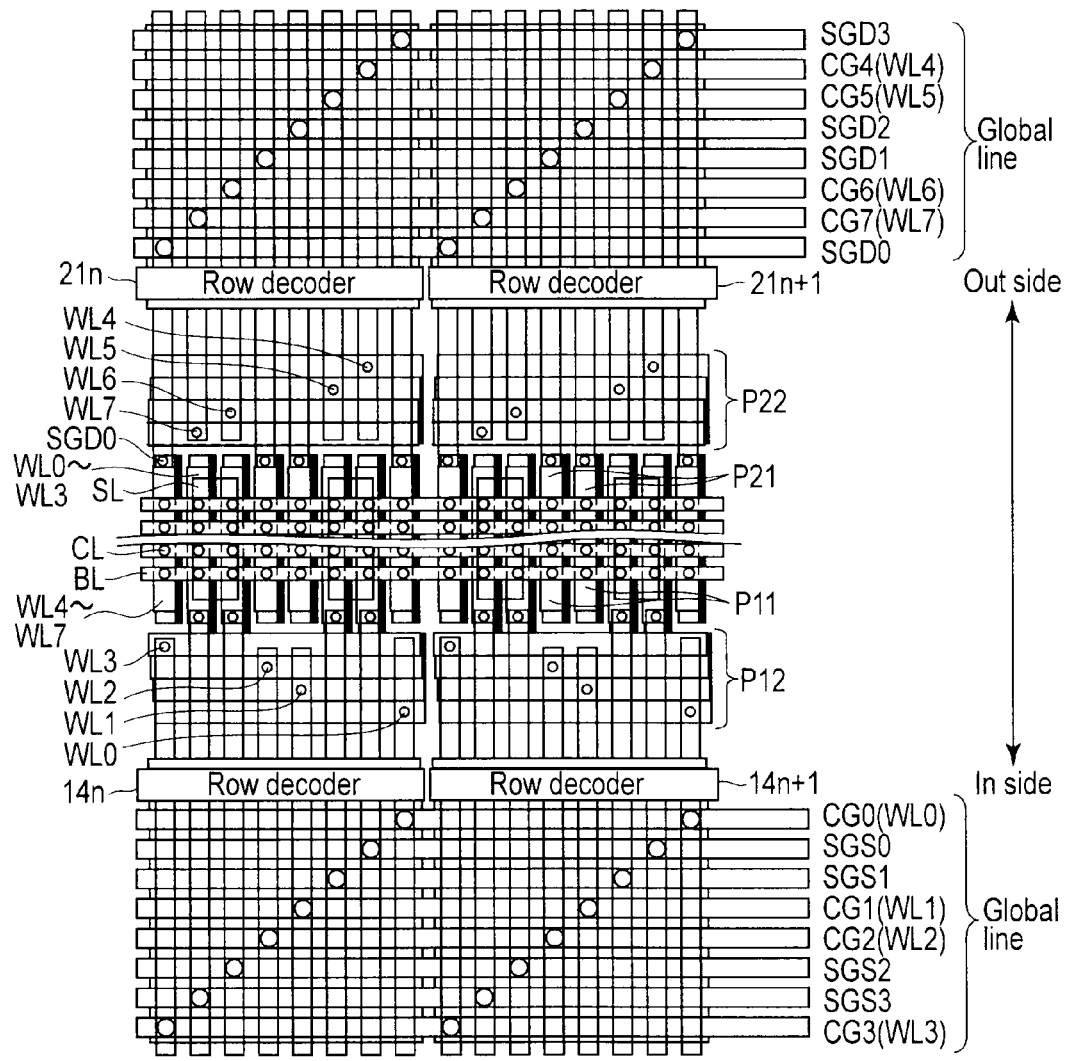
F I G. 3

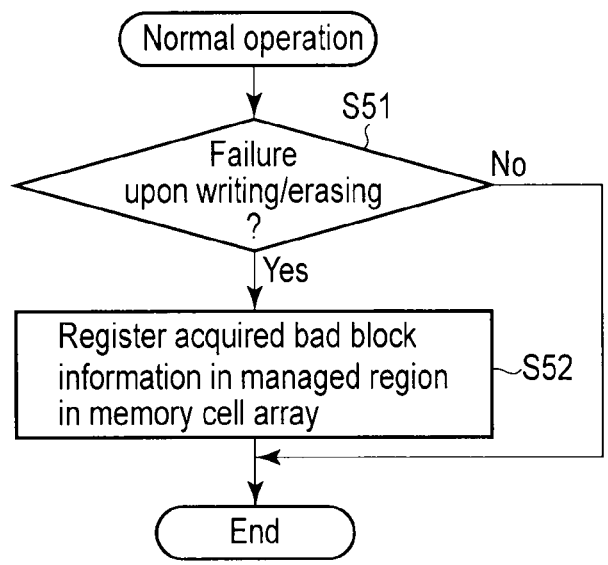
F I G. 1 0 A
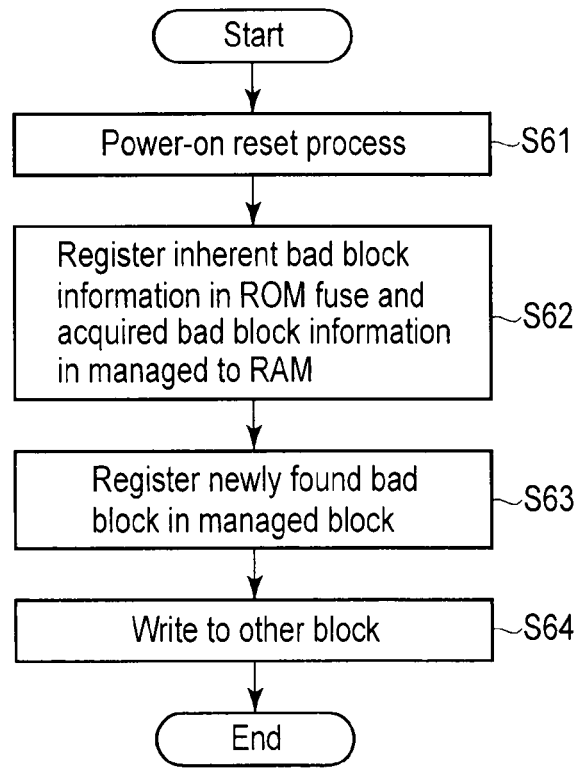
F I G. 1 0 B

NON-VOLATILE SEMICONDUCTOR MEMORY DEVICE CAPABLE OF IMPROVING FAILURE-RELIEF EFFICIENCY

CROSS-REFERENCE TO RELATED APPLICATIONS

This application is based upon and claims the benefit of priority from prior Japanese Patent Application No. 2011-004953, filed Jan. 13, 2011, the entire contents of which are incorporated herein by reference.

FIELD

Embodiments described herein relate generally to a non-volatile semiconductor memory device, for example, a NAND flash memory.

BACKGROUND

In the recent years, as an approach to improving the bit density of a NAND flash memory, a memory using a stacked NAND flash memory in which memory cells are stacked, a so-called bit-cost scalable (BiCS) flash memory, is being proposed.

BRIEF DESCRIPTION OF THE DRAWINGS

FIG. 1 is a block diagram showing a circuit configuration of a non-volatile semiconductor memory device of a first embodiment;

FIG. 2 is a perspective view showing an example of an element structure of a memory cell array of the non-volatile semiconductor memory device of the first embodiment;

FIG. 3 is a top view showing a configuration of an electrode extracting portion of the memory cell array of FIG. 2;

FIGS. 10A and 10B are flowcharts showing an example of a process for an acquired bad block that occurs after shipment;

DETAILED DESCRIPTION

Figure 4:
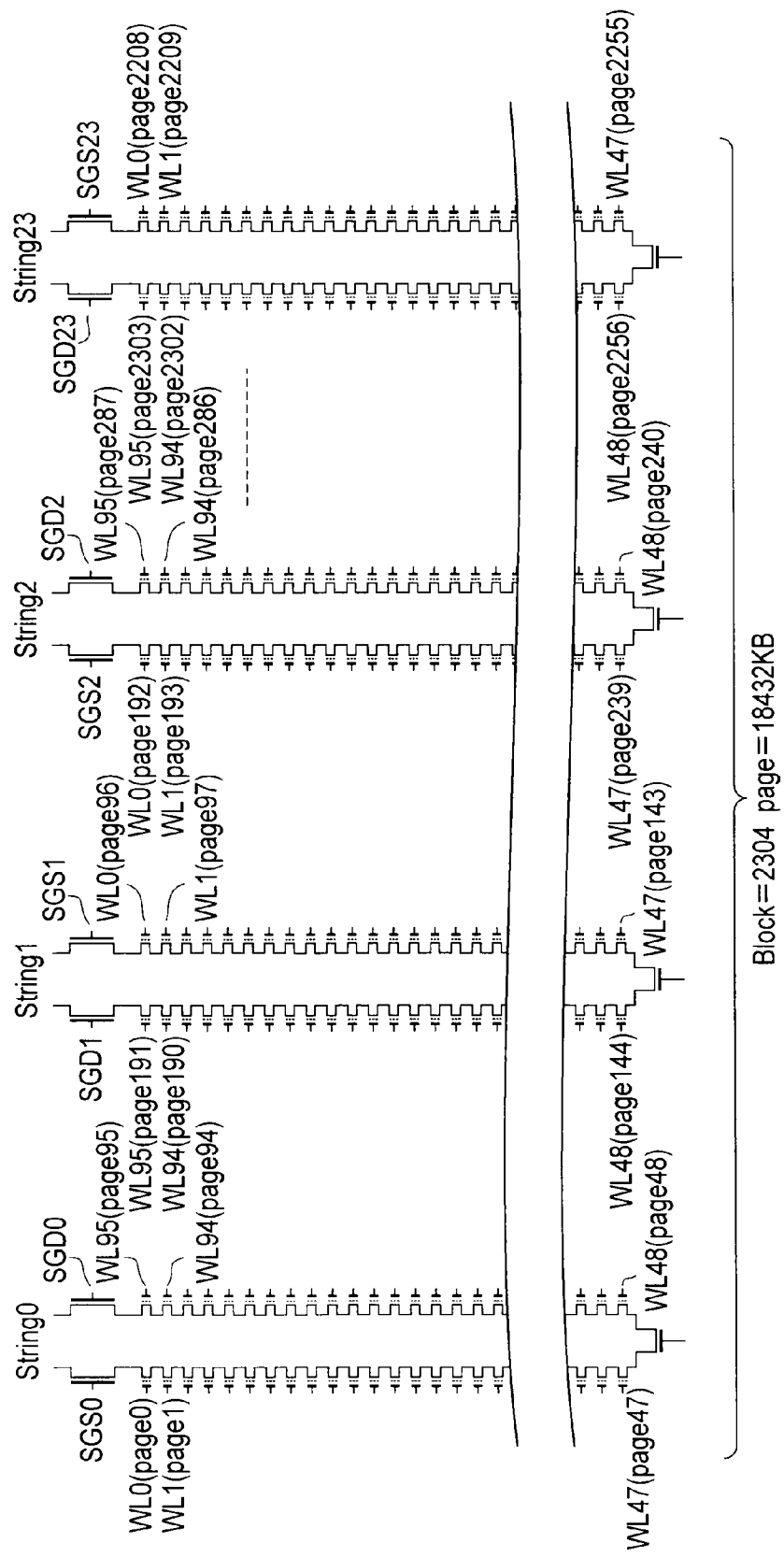
FIG. 4 is a diagram showing a block configuration of a typical p-BiCS memory.

In general, according to one embodiment, a non-volatile semiconductor memory device includes a memory cell array and a row decoder. The memory cell array has a set of a plurality of NAND strings as a physical block, where the plurality of NAND strings respectively includes a plurality of memory cells, and shares a plurality of word lines respectively connected to the plurality of memory cells. The row decoder drives the plurality of word lines. The physical block is divided into a plurality of first logical blocks. The row decoder includes a plurality of latch circuits and a drive circuit. The plurality of latch circuits is provided respectively corresponding to the plurality of first logical blocks, and when a failure exists within a corresponding first logical block, it stores a flag indicating the failure. The drive circuit inhibits driving of the word lines belonging to the first logical block when the flag is stored in the latch circuit corresponding to the first logical block to which the selected word lines belong, and allows the driving of the word lines belonging to the physical block including the first logical block when the flag is not stored in the latch circuit corresponding to the first logical block to which the selected word lines belong.

Hereinafter, embodiments will be described with reference to the drawings. In all of the drawings, same reference signs are given to same components. Further, dimensional ratio of the drawings is not limited to the ratio shown in the drawings.

First Embodiment

Configuration of Non-Volatile Semiconductor Memory Device

FIG. 1 is a block diagram showing a circuit configuration of a three-dimensional stacked non-volatile semiconductor memory device of a first embodiment.

The three-dimensional stacked non-volatile semiconductor memory device of the present embodiment includes a BiCS flash memory 10 and a memory controller 20. Here, the BiCS flash memory 10 is provided with a memory cell array 11, a sense amplifier 12, a column address buffer/column decoder 13, row decoders 14 and 21, a control circuit 15, a voltage generation circuit 16, a power-on detection circuit 17, a row address buffer 18, and an input/output buffer 19.

As will be described later, the memory cell array 11 is a three-dimensional stacked non-volatile semiconductor memory device in which a plurality of memory cells is stacked in a vertical direction. A part of the blocks in the memory cell array 11 is used, for example, as a ROM fuse region 11a and a managed region 11b. In the ROM fuse region 11a, for example, column replacement information for replacing a failed column, parameters for determining respective operation modes, trimming results for generating respective voltages and bad block information indicating failed blocks are stored. Further, as will be described later, in the managed region 11b, bad block information indicating a bad block that includes an acquired failure is stored.

<Sense Amplifier and Column Address Buffer/Column Decoder>

As shown in FIG. 1, the sense amplifier 12 is connected to the memory cell array 11 via bit lines BL. The sense amplifier 12 performs reading data in the memory cell array 11 in a page unit upon reading, and writes data in the memory cell array 11 in the page unit upon writing.

Further, the sense amplifier 12 is also connected to the column address buffer/column decoder 13. The sense amplifier 12 decodes a select signal input from the column address buffer/column decoder 13, and selects and drives one of the bit lines BL.

The sense amplifier 12 also provides a function of a data latch retaining data upon the writing. The sense amplifier 2 of the present embodiment comprises a plurality of data latch circuits. For example, a sense amplifier adapted to a multi-level cell (MLC) that stores 2 bits of data in one cell comprises three data latches.

The column address buffer/column decoder 13 temporarily stores a column address signal that is input from the memory controller 20 via the input/output buffer 19, and outputs a select signal that selects one of the bit lines BL according to the column address signal to the sense amplifier 12.

<Row Decoder>

The row decoders 14 and 21 decode a row address signal that is input via the row address buffer 18, and selects and drives word lines WL and select gate lines SGD, SGS of the memory cell array. Further, the row decoders 14 and 21 comprise a portion that selects a block in the memory cell array 11 and a portion that selects a page.

Note that, the BiCS flash memory 10 of the present embodiment comprises an external input/output terminal I/O that is not shown, and transmission of data with the input/output buffer 19 and the memory controller 20 is performed via this external input/output terminal I/O. Address signals input via the external input/output terminal I/O are output to the row decoders 14 and 21 and the column address buffer/column decoder 13 via the row address buffer 18.

<Control Circuit>

The control circuit 15 controls a sequence control of data writing and erasing, as well as a read operation based on respective external control signals (a write enable signal WEn, a read enable signal REn, a command latch enable signal CLE, an address latch enable signal ALE, etc.) and a command CMD that are supplied via the memory controller 20. The control circuit 15 automatically performs an initialization operation responsive to receiving a power-on detection signal that is input from the power-on detection circuit 17.

<Voltage Generation Circuit>

A voltage generation circuit 16 is controlled by the control circuit 15, and generates respective internal voltages that are needed in the operations of writing, erasing and reading. This voltage generation circuit 16 comprises a boosting circuit for generating an internal voltage higher than a power voltage.

<Power-on Detection Circuit>

The power-on detection circuit 17 is connected to the control circuit 15. The power-on detection circuit 17 detects the power being turned on, and outputs a detection signal to the control circuit 15.

<Memory Controller>

The memory controller 20 outputs commands, etc. that are needed for operations of the BiCS flash memory 10, and performs reading, writing and erasing of the BiCS flash memory 10. This memory controller 20 includes a random access memory (RAM) and an error correcting code (ECC) circuit. The ECC circuit corrects an error included in data read from the memory cell array 11.

<Memory Cell Array>

FIG. 2 and FIG. 3 show the memory cell array 11 of the present embodiment. Note that, for the sake of simplicity of the explanation, FIG. 2 and FIG. 3 are depicted with the number of layers of the word lines WL being four layers.

FIG. 2 is a perspective view showing an example of an element structure of the memory cell array 11 of the present embodiment. The memory cell array of the present embodiment is a p-BiCS memory in which lower ends of a plurality of adjacent and serially connected memory cells are connected by transistors called pipe connections.

The memory cell array 11 comprises m×n cells (m and n being natural numbers) of NAND strings MS. FIG. 2 shows an example of m=6 and n=2. Each of the NAND strings MS has the lower ends of the adjacent and serially connected transistors (MTr0 to MTr7) connected in pipe connection, and at upper ends, source-side select transistors SSTr and drain-side select transistors SDTr are arranged.

In the non-volatile semiconductor memory device of the present embodiment, the memory transistors MTr (herein below referred to as memory cells) configuring the NAND strings MS are formed by stacking a plurality of semiconductor layers. Each of the NAND strings MS comprises a U-shaped semiconductor SC, word lines WL (WL0 to WL7), a source-side select gate line SGS, and a drain-side select gate SGD. Further, the NAND string MS comprises a back gate line BG.

The U-shaped semiconductor SC is formed in a U-shape as seen from a row direction. The U-shaped semiconductor SC comprises a pair of columnar sections CL extending in a substantially vertical direction relative to a semiconductor substrate Ba, and a joining section JP formed so as to join lower ends of the pair of columnar sections CL. Note that, the columnar sections CL may be circular pillars, or may be square pillars. Further, the columnar sections CL may be pillars having the shape of steps. Here, the row direction is a direction orthogonal to a layer-stacking direction, and a column direction that will be described later is a direction orthogonal to a vertical direction and the row direction.

The U-shaped semiconductor SC is arranged such that a straight line connecting center axes of the pair of columnar sections CL is parallel to the column direction. Further, the U-shaped semiconductor SC is arranged so as to be a matrix within a plane configured of the row direction and the column direction.

The word line WL in reach layer extends parallel to the row direction. The word line WL in reach layer is formed in a linear shape in the column direction with a certain interval, and electrically isolated from one another.

Gates of the memory cells (MTr0 to MTr7) provided at the same position in the column direction and arranged in the row direction are connected to the same word line WL. Each of the word lines WL is arranged substantially vertical to the NAND string MS.

The drain-side select gate SGD is provided above the topmost word line WL, and extends parallel to the row direction. The source-side select gate line SGS is provided above the topmost word line WL, and extends parallel to the row direction, as is similar to the drain-side select gate SGD.

Further, the source-side select transistor SSTr is connected to a common source line SL, and the drain-side select transistor SDTr is connected to the bit lines BL in the topmost layer.

FIG. 3 shows a top view showing a layout of an extracting portion of the word lines WL, and shows two blocks (Block n, Block n+1).

As described above, in regards to one NAND string formed on one U-shaped semiconductor SC, a group of word lines WL0 to WL3 provided on one of the columnar sections CL and a group of word lines WL4 to WL7 provided on the other of the columnar sections CL are extracted in opposite directions with respect to each other. In the example of FIG. 3, the drain-side select gate SGD is extracted, for example, to an Out side, and the source-side select gate line SGS is extracted, for example, to an In side. The reason for extracting in the opposite directions as above is to suppress an increase in the number of metal interconnect layers.

Since the p-BiCS memory as above includes four layers of word lines WL, one string is configured of eight word lines WL. Each of word lines WL0 to WL3 and WL4 to WL7 is formed in a comb shape. That is, word lines WL0 to WL3 comprise main bodies P11 of the word lines to which the columnar section CL is provided, and are provided orthogonal to the bit lines BL respectively, and word lines WL4 to WL7 comprise main bodies P12 of the word lines to which the columnar section CL is provided, and are provided orthogonal to the bit lines BL respectively. The main bodies P11 of word lines WL0 to WL3 and the main bodies P12 of word lines WL4 to WL7 are respectively arranged every two lines in each and common layer. One ends (In side end portions) of the plurality of main bodies P11 of word lines WL0 to WL3 are commonly connected respectively by a plurality of joining sections P12 arranged along the bit lines BL. Further, the other ends (Out side end portions) of the plurality of main bodies P21 of word lines WL4 to WL7 are commonly connected respectively by a plurality of joining sections P22 arranged along the bit lines BL.

In the In side of each block BLKn, BLKn+1, row decoders 14n, 14n+1 are provided, respectively, and in the Out side of each block BLKn, BLKn+1, row decoders 21n, 21n+1 are provided.

That is, in the outside of the row decoders 14n, 14n+1, global interconnects CG0 to CG3 and source-side select gate lines SGS0 to SGS3 are arranged. The global interconnects CG0 to CG3 are connected to the word lines WL0 to WL3 via extended lines connected to the row decoders 14n, 14n+1. The source-side select gate lines SGS0 to SGS3 are connected source-side select gate lines SGS0 to SGS3 having the same name via extended lines connected to the row decoders 14n, 14n+1.

Further, in the outside of row decoders 21n, 21n+1, global interconnects CG4 to CG7 and the drain-side select gate lines SGD0 to SGD3 are arranged. The global interconnects CG4 to CG7 are connected to the word lines WL4 to WL7 via extended lines connected to the row decoders 21n, 21n+1. The drain-side select gate lines SGD0 to 3 are connected to the drain-side select gate lines SGD0 to SGD3 having the same name via extended lines connected to the row decoders 21n, 21n+1. Furthermore, in the In-side and Out-side, the row decoder corresponding to an unselected block becomes inactive state. Thus, voltage is not supplied to the memory cell array the memory cell array becomes a floating state.

FIG. 4 shows a block configuration of a typical p-BiCS memory. As shown in FIG. 4, this p-BiCS memory comprises 48 layers of word lines, and has 24 U-shaped strings as one block. When a page length is 8 KB and being a single-level cell (SLC) storing 1 bit per one memory cell, a capacity of one block is 18432 KB. This is extremely large compared to a NAND flash memory having 64 word lines per one block and the page length of 8 KB (the capacity per block is 512 KB).

Further, in a typical planar NAND flash memory, for example, in a case where adjacent word lines are short circuited, a block including these word lines becomes incapable of being used for being a bad block (failed block). In a case of adapting this kind of typical control of a NAND flash memory to a p-BiCS memory having a large block capacity, a large capacity becomes incapable of being used. Because of this, the p-BiCS memory has a possibility that the available capacity is reduced at a speed of several tens of times that of the typical NAND flash memory because of a bad block.

Thus, the present embodiment is configured as below in order to prevent the decrease in the available capacity.

Herein below, in each embodiment, a set of strings having common word lines is referred to as a physical block (physical block). Further, in each embodiment, a block does not mean a unit of erasure. The erasure of data can be performed, for example, in a unit of strings sharing a source line SL, or other units.

Figure 5:
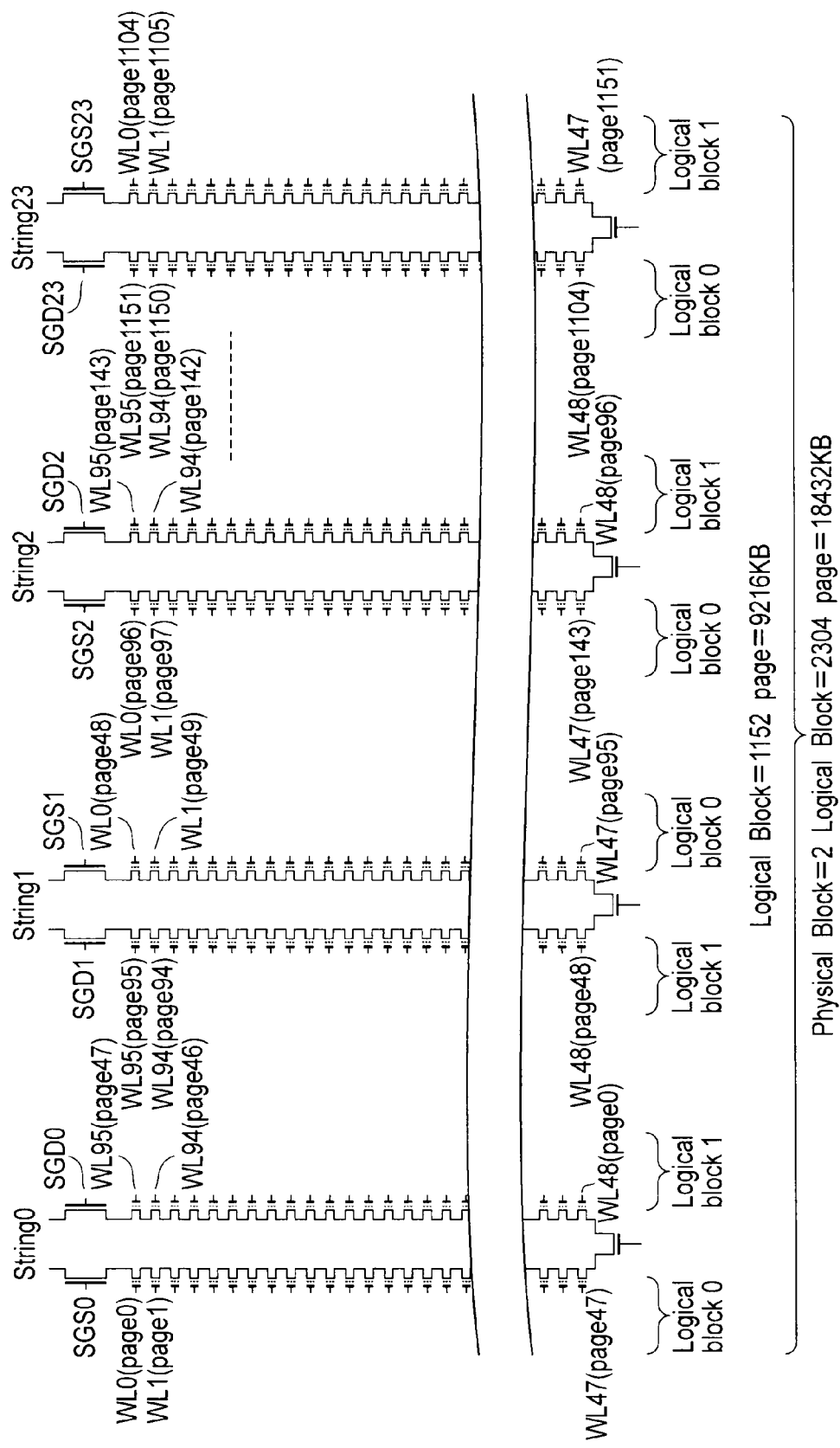
FIG. 5 is a diagram showing a block configuration of a p-BiCS memory of the first embodiment.

FIG. 5 shows a block configuration of the present embodiment. FIG. 5 shows a configuration of one physical block. As aforementioned, in the p-BiCS memory of the present embodiment, a plurality of memory cells having common word lines configure one logical block (logical block). As shown in FIG. 5, a plurality of memory cells connected to word lines WL0 to WL47 configure a logical block 0, and a plurality of memory cells connected to word lines WL48 to WL95 configure a logical block 1. That is, these two logical blocks (also referred to as first logical blocks. Herein below, logical blocks used in the first embodiment represent the first logical blocks) configure the physical block. These two logical blocks are selected and driven independently by the row decoder.

According to this configuration, for example, in between different layers, for example, in logical block 0, in the case where the adjacent word lines are short circuited, only logical block 0 is determined as the bad block, and logical block 1 can be determined as a normal block. By configuring as above, it becomes possible to suppress the capacity that becomes incapable of using to ½.

Thus, the row decoder of the present embodiment provides two latches that correspond to the respective ones of the two logical blocks and that retain, for example, two flags (BBF_L, BBF_R) indicating the bad blocks.

Figure 6:
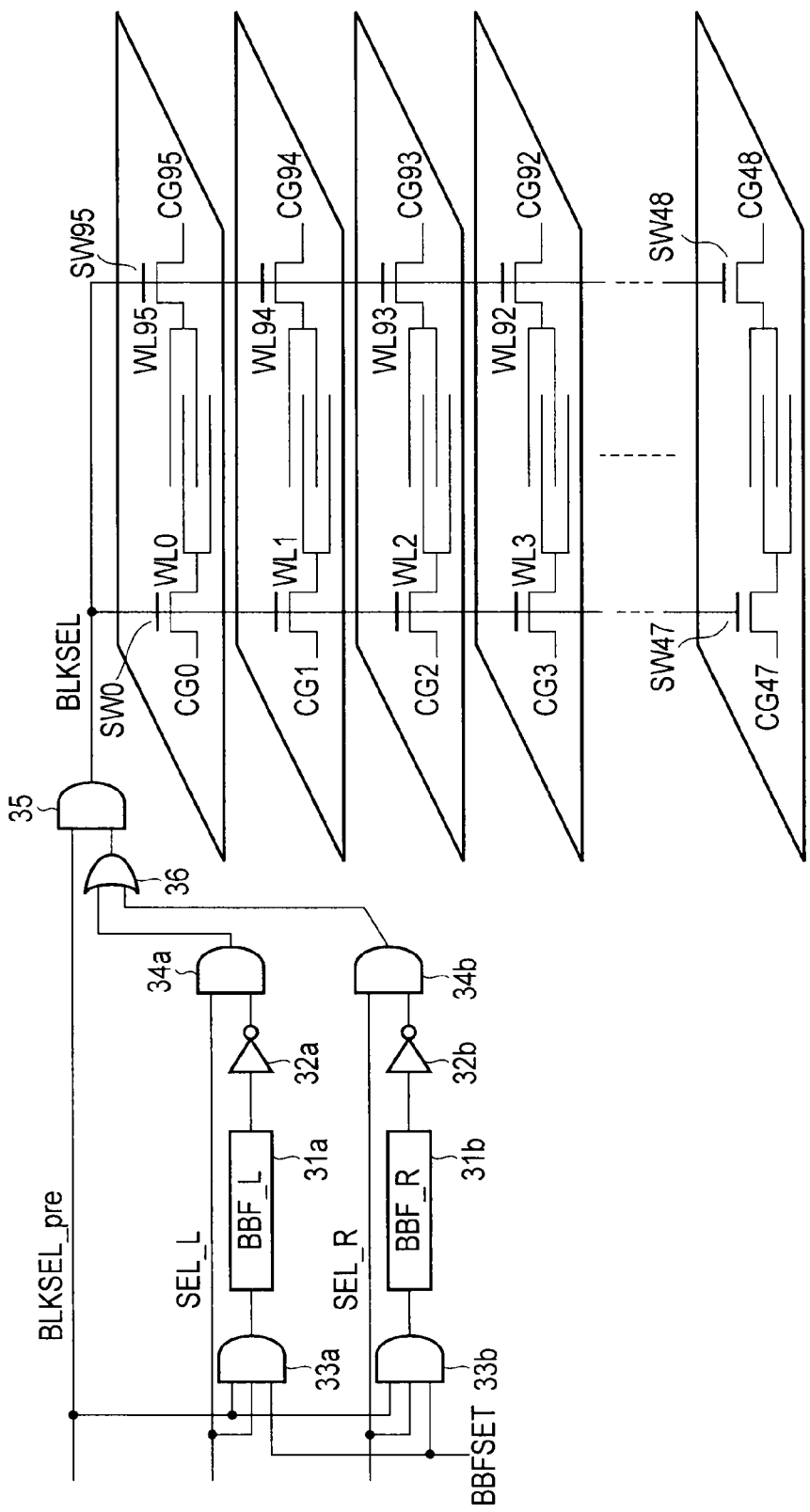
FIG. 6 is a block diagram showing a circuit configuration of a row decoder unit of the non-volatile semiconductor memory device of the first embodiment.

FIG. 6 shows an example of a block decode included in the row decoder of the present embodiment. As shown in FIG. 6, the block decoder is configured of latch circuits 31a, 31b respectively retaining flags BBF_L and BBF_R, inverters 32a, 32b, AND gates 33a, 33b, 34a, 34b, 35 and an OR gate 36.

The AND gate 33a inputs a block select signal BLKSEL_pre, a signal SEL_L including special conditions such as a test, and a signal BBFSET, and outputs them to the latch circuit 31a. The AND gate 33b inputs a block select signal BLKSEL_pre, a signal SEL_R including special conditions such as a test, and a signal BBFSET, and outputs them to the latch circuit 31b.

Outputs of the latch circuit 31a are supplied to one of input terminals of the AND gate 34a via the inverter 32a. Signal SEL_L is supplied to the other of the input terminals of the AND gate 34a. Outputs of the latch circuit 31b are supplied to one of input terminals of the AND gate 34b via the inverter 32b. Signal SEL_R is supplied to the other of the input terminals of the AND gate 34b.

Outputs of the AND gates 34a, 34b are supplied to the OR gate 36, and an output of the OR gate 36 is supplied to one of input terminals of the AND gate 35. Further, the block select signal BLKSEL_pre is supplied to the other of the input terminals of the AND gate 35. Consequently, an output of the AND gate 35 is output as a block select signal BLKSEL. The AND gates 34a, 34b and 35 and the OR gate 36, for example, configures the drive circuit of the word lines.

Flags BBF_L, BBF_R indicating failures are, for example, set in the latch circuits 31a, 31b in a power-on reset process when power is turned on. Because of this, a failed physical block address is stored in the ROM fuse region 11a of the memory cell array 11. The failed physical block address stored in the ROM fuse region 11a is read in the power-on reset process as will be described later. Based on this address, the latch circuits 31a, 31b are set.

Further, in the ROM fuse region 11a, as will be described later, a flag indicating a failure and a logical block address, which is a unit by which the failed blocks are dealt, are retained in association based, for example, on a result of a die sorting test.

In the memory cell array with the block configuration shown in FIG. 5, as shown in FIG. 6, word lines WL0 to WL47 that are extracted toward one side (the in side) are connected to control signal lines CG0 to CG47 via switching transistors, respectively. That is, word line WL0 is connected to CG0 via the transistor SW0, word line WL1 is connected to CG1 via the transistor SW1, and word line WL47 is connected to CG47 via the transistor SW47.

Further, word lines WL48 to WL95 that are extracted toward the other side (the Out side) are connected to control signal lines CG48 to CG95 via switching transistors, respectively. That is, word line WL95 is connected to CG95 via the transistor SW95, word line WL94 is connected to CG94 via the transistor SW94, and word line WL48 is connected to CG48 via the transistor SW48. Respective gates of the transistors SW0 to SW95 are commonly connected to an output terminals of the AND gate 35.

Note that, the control signal lines CG0 to CG95 are connected to a page decoder (not shown) for selecting a page.

Here, signal SEL_L is a signal that is high when word lines WL0 to WL47 are selected in a user mode such as a write operation, read operation, erase operation, etc. Similarly, signal SEL_R is a signal that is high when word lines WL48 to WL95 are selected in the user mode.

In the present embodiment, for example, when word lines WL0 and WL1 are short circuited, flag BBF_L indicating the failure is set in the latch circuit 31a corresponding to logical block 0, and the latch circuit 31a is made high. That is, signals BLKSEL_pre, SEL_L, and BBFSET are high, and high is set in the latch circuit 31a.

Accordingly, for example, in a case where one of word lines WL0 to WL47 of logical block 0 is to be selected in the write operation, and signals BLKSEL_pre, SEL_L are high, since the output signal from the latch circuit 31a is high, the block select signal BLKSEL to be output from the AND gate 35 is not made high. Accordingly, an unselected state occurs in a physical block unit, where all of the word lines WL of logical blocks 0 and 1 retain floating states, and no undesirable influence is imposed on other components.

On the other hand, when word lines WL48 to WL95 of this physical block are to be selected, and signals BLKSEL_pre, SEL_R are high, since an output signal of the latch circuit 31b is low, the block select signal BLKSEL to be output from the AND gate 35 is made high, and the physical block is brought to be in a selected state. At this occasion, $V_{PGM}$ is applied to the selected WL via one of the transistors SW48 to SW95, and voltages corresponding to the boost options such as VISO/VGP/VPASS are transferred to the word lines around the selected word line.

Here, VISO is, for example, a voltage for channel separation that is lower than Vpass that turns on a memory cell in an erased state, and is higher than VISO. Further, in the program operation, in the case where word lines WL48 to WL95 of logical block 0 are selected, Vpass is applied to all of word lines WL0 to WL47. This is because, for example, word line WL0 is apart from word lines WL48 to WL95, and there is no need for a control to improve a boost efficiency. As a result, it can be expected that even if word lines WL0 and WL1 are short circuited, there will not be any problem.

Figure 7:
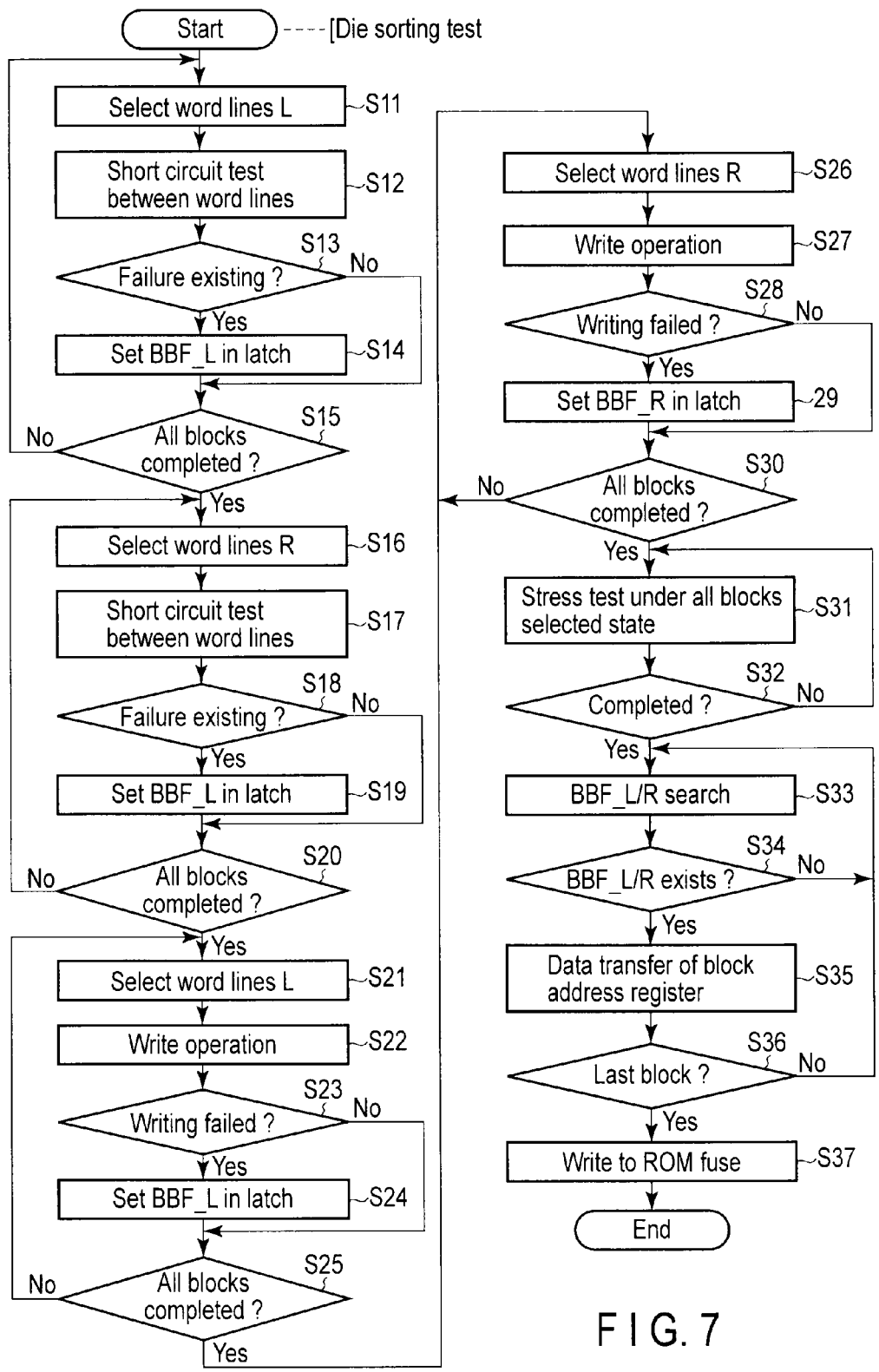
FIG. 7 is a flowchart showing an operation in a die sorting test.

FIG. 7 shows an operation upon a die sorting test. In order to perform the above operation, in the die sorting test, various tests are performed by a tester, and a bad block is detected from the memory cell array 11. An address of the detected bad block is stored in the ROM fuse region 11a.

As aforementioned, word lines WL0 to WL47 and word lines WL48 to WL95 shown in (FIG. 4) register the bad block using different latch circuits in the common row decoder. Since there is the need to perform the determination of good/bad blocks in a unit by which the bad block is to be registered, in the die sorting test, word lines WL0 to WL47 and word lines WL48 to WL95 need to be tested separately. Here, word lines WL0 to WL47 will be termed word lines L for the sake of simplicity, and word lines WL48 to WL95 will be termed word lines R in the below explanation.

In the die sorting test, firstly, for example, word lines L of logical block 0 are selected (S11), and a short circuit test between adjacent word lines is performed (S12).

Specifically, the short circuit test is performed in a state where all of the memory cells connected to word lines R are set at a certain threshold voltage, and all of the memory cells connected to the selected word lines L are set at an erased level. The certain threshold voltage is a level that is higher than, for example, the erased level (negative threshold voltage), and lower than Vread (a voltage capable of causing the unselected cell to be in conducted states during reading), for example, about 3 V. In this state, Vread, for example, 5 V, is applied to word lines R, and ground potential Vss is applied to word lines L. Because of this, all of the memory cells connected to word lines R, L are brought to the on-state.

In this state, when word lines L and word lines R are normal, charges on the bit lines are discharged via the memory cells in the on-state. Accordingly, the bit lines are made low.

Further, in a case where a short circuited portion exists in word lines L or word lines R, memory cells in an off-state occurs since Vread stops being applied to the gate electrodes of the memory cells connected to word lines L or word lines R. Accordingly, in this case also, the charges on the bit lines are not discharged, and the bit lines are kept high.

Potential of the above bit lines is detected by the sense amplifier. That is, the output of the sense amplifier is low when the word lines are normal, and is high when short circuited word lines are detected.

As a result of the above test, in the case where word lines L in the short circuited state are detected, flag BBF_L is set in the latch circuit 31a of the logical block that includes word lines L (S13, S14). Specifically, a BBF set command is issued by the tester, and flag BBF_L is set in the latch circuit 31a of logical block 0 that is currently being selected. That is, in the p-BiCS memory, for example, signals BLKSEL_pre, SEL_L, and BBFSET are high, and high flag BBF_L is set in the latch circuit 31a.

The testing operation that selected the above word lines L is performed for all of the logical blocks (S15 to S11).

On the other hand, in the case where the testing operation that selected word lines L for all of the logical blocks is completed, similar operation as above is performed in the state of word lines R being selected (S16 to S19). As a result, in the case where word lines R in the short circuited state are detected, flag BBF_R is set in the latch circuit 31b of the logical block that includes word lines R. The testing operation that selected the above word lines R is performed for all of the logical blocks (S16 to S20).

In the case where the testing operation that selected word lines R for all of the logical blocks is completed, one word line among word lines L of one logical block is selected (S21), and a normal write operation is performed (S22).

In the write operation, in the tester, a write command, address, data and an execution command for writing are generated. Here, for example, in a case with a chip having 1024 logical blocks, block addresses are set in a 10-bit block address register, and a corresponding logical block is brought to be in an active state.

Next, after the write operation is completed, a status read is performed, and the status of the non-volatile semiconductor memory device is checked (S23).

As a result, when the writing fails, a BBF set command is issued by the tester, and flag BBF_L is set in the latch circuit 31a of the logical block that includes word lines L (S24). At this occasion, in the latch circuit 31a, in the case where flag BBF_L is already set by the short circuit test of the word lines, even if writing is attempted on word lines L, the block select signal BLKSEL is not made high, and the write operation cannot be performed. As a result, flag BBF_L is set anew.

Note that, in a case where an open exists in the word lines, the logical block including this word line fails in its writing. Because of this, the determination on a bad book can be performed.

The above operation is performed for all of the logical blocks (S25 to S21). In the case where the write operation that selected word lines L for all of the logical blocks is completed, similar operation as above is performed in the state of word lines R being selected (S26, S27). As a result, in the case where the writing fails, the BBF set command is issued by the tester, and flag BBF_R is set in the latch circuit 31b of the logical block that includes word lines R (S28, S29). At this occasion, in the latch circuit 31b, there are cases in which flag BBF_R is already set by the short circuit test of the word lines. In the case where flag BBF_R is already set, even if writing is attempted on word lines R, the block select signal BLKSEL is not made high, and the write operation cannot be performed. As a result, flag BBF_R is set anew.

The above operation is performed for all of the logical blocks (S30 to S26). In the case where the write operation that selected word lines R for all of the logical blocks is completed, it means that flag BBF_L or BBF_R is set in the latch circuit 31a or 31b corresponding to the failed block.

Accordingly, by setting flag BBF_L or BBF_R in the latch circuit 31a or 31b corresponding to the failed block, a stress test, etc. becomes capable of being performed in the state where word lines L or word lines R are selected (S31).

This stress test is a test in which, for example, Vdd (2.5 V) is applied to word lines R and, for example, Vpass (8 V) is applied to word lines R, and screens minor leaks by leaving them unattended over a long period of time. At this occasion, in a case where a logical block that has a short circuit between word lines R and word lines L exists, and flag BBF_L or BBF_R is not set in the latch circuit 31a or 31b corresponding to that logical block, it means that a predetermined stress of Vdd-Vpass cannot be applied not only to this logical block, but also to all of the logical blocks. Accordingly, it becomes essential to set flag BBF_L or BBF_R at a step prior to the die sorting test.

After the above stress test is completed (S32), flags BBF_L and BBF_R are searched (S33, S34). In this case, firstly, an access is made in order from logical block 0, and whether or not flags BBF_L and BBF_R are set in the corresponding latch circuit 31a or 31b is detected. In the case where flags BBF_L and BBF_R are set, data of the logical block address register at that time (bad block address) is transferred to the data latch circuit not shown of the sense amplifier 12 (S35). This operation is continued to the last logical block (S36), and all of the failure information is transferred to the data latch circuit of the sense amplifier 12. At this occasion, the column replacement information for replacing the failed column, the parameters for determining the respective operation modes, the trimming results for generating the respective voltages are also transferred to the data latch circuit of the sense amplifier. After all of the information is transferred to the data latch circuit, the data in the data latch circuit is programmed to the ROM fuse region 11a of the memory cell array 11 (S37).

Figures 8, 9:
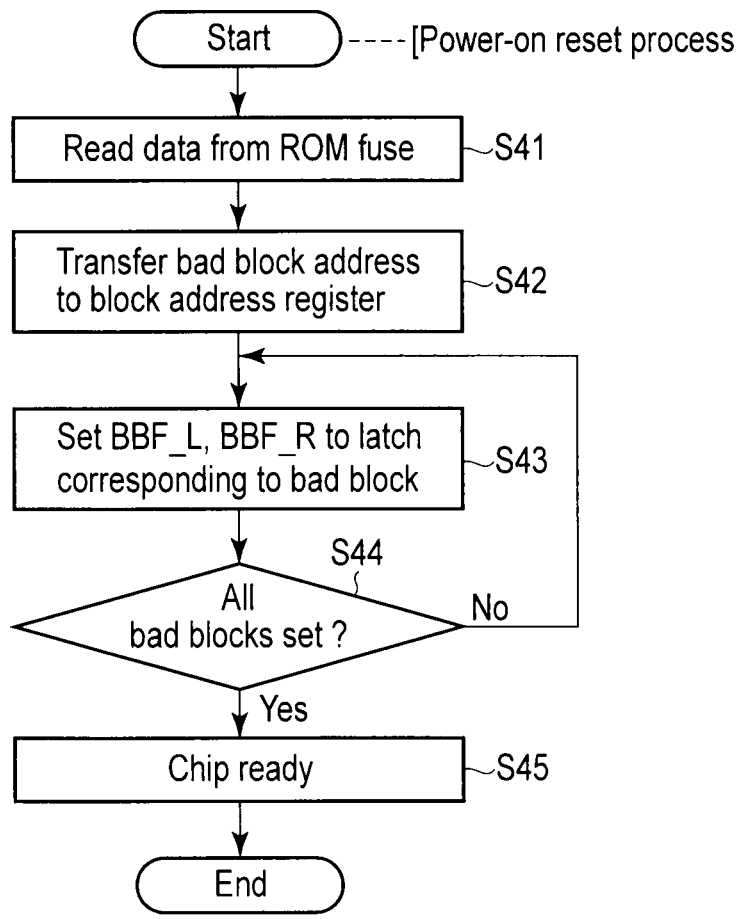
FIG. 8 is a diagram showing a failed block address map.
FIG. 9 is a flowchart showing an operation in a power-on reset process.

FIG. 8 shows a failed block address map. As shown in FIG. 8, in this address map, for example, of the 2-bits retained in a region A, the 1-bit corresponding to R corresponds to the information of flag BBF_R (indicating a failure by "1" and a normality by "0"), and the 1-bit corresponding to L corresponds to the information of flag BBF_L. That is, in a case where word lines in the short circuited state are detected or a page in which the write operation cannot be performed is detected, "1" is set corresponding to the detected logical block address.

In FIG. 8, "0" denotes the normality, and "1" denotes the failure. For example, in the region shown as A, a logical block (Block) 204 has word lines R as "0" and word lines L as "1", and a logical block 435 has word lines R as "1" and word lines L as "0". A logical block 687 has both word lines R and word lines L as "1". Because of this, in the region A of the logical block 687, since the test results for word lines R and L are both "1", it can be understood that there is the possibility that word lines R and word lines L are short circuited.

FIG. 9 shows an operation in an example of setting flags BBF_R and BBF_L in the power-on reset process of the p-BiCS memory of the present embodiment. For the sake of a simple explanation, only the settings of the flags in the power-on reset process will be explained.

When the power-on detection circuit 17 detects that the power has been turned on, the power-on reset process as an initialization operation is performed by the control circuit 15.

In this power-on reset process, the bad block addresses stored in the ROM fuse region 11a in the memory cell array 11 are read, and one of flags BBF_L and BBF_R is set in one or both of the latch circuits 31a, 31b of the corresponding logical block.

Specifically, the bad block addresses, column replacement information, and trimming information are read from the ROM fuse region 11a, and are retained in a data latch circuit not shown of the sense amplifier 12 (S41).

Of these read data, the column replacement information is transferred to a circuit configured to relieve the failed column, and the trimming information is supplied to the voltage generation circuit 16. Further, the bad block addresses are transferred to the block address register (S42). As aforementioned, the block address register is configured by 10 bits in the case where the memory cell array 11 has 1024 logical blocks. By having the block addresses and the bad block addresses set in this block address register, logical blocks of the corresponding addresses are brought to the selected state.

When the logical block is set in the selected state, signal BBFSET shown in FIG. 6 is issued, and one of flags BBFL and BBF_R is set in one or both of the latch circuits 31a, 31b corresponding to the bad block (S43). Accordingly, in the case where flag BBF_L or BBF_R is set, the logical block cannot be selected until flag BBF_L or BBF_R is reset.

The setting operation of the above flags BBF_L and BBF_R is repeated for a same number of times as a number of the bad blocks registered in the ROM fuse region 11a (S44, S43).

When the setting of above flags BBF_L and BBF_R is completed, the chip is brought to be in a chip ready state in which accesses can be made, and becomes capable of receiving commands from a controller (S45).

Because of the above operation, inherent bad blocks that were determined as failed blocks during the die sorting are retained in the unselected state because of the setting of flags BBF_L and BBF_R having been completed.

FIGS. 10A and 10B show an example of a process for an acquired bad block occurred after a shipment.

In a state where a write or erase operation has been performed by a user and the writing or erasing has failed, the logical block failed its writing or erasing needs to be managed as an acquired bad block.

That is, as shown in FIG. 10A, it is determined upon the writing or erasing whether the writing or erasing has failed or not (S51). As a result, in the case where the writing or erasing failed, the address of the logical block failed the writing or erasing is retained, for example, in a RAM of the memory controller 20 as acquired bad block information. The controller 20 registers this address in a managed region 11b in the memory cell array 11 (S52). This managed region is generated, for example, in a block address 0 or 1023 of the memory cell array 11.

FIG. 10B shows the initialization operation upon using the non-volatile semiconductor memory device. When the power is turned on, the power-on reset process is performed, and the chip ready state is set (S61). In this state, the acquired bad block addresses stored in the managed region 11b of the memory array 11 are read, and are registered, for example, in the RAM in the memory controller 20 (S62). The addresses registered in this RAM are controlled by the memory controller 20 so as not to be accessed.

Further, in the case where the writing failure or the erasing failure newly occurs, that logical block is determined as a bad block. In this case, the information in the managed region 11b is read, and the information of the bad block that has newly occurred is added to the managed region 11b (S63). Thereafter, writing is performed on remaining logical blocks other than the bad blocks (S64).

The new bad block address registered in the managed region 11b is transferred to the RAM of the controller 20 after the subsequent power-on reset process, and is managed so as not to be accessed thereafter.

As aforementioned, the inherent bad blocks hinders the testing upon the die sorting test. Therefore, it is essential to set flags BBF_L and BBF_R in the latch circuits 31a, 31b, and cause the bad blocks to be unselected upon the die sorting test.

Further, flags BBF_L and BBF_R are set in the latch circuits 31a, 31b for every power-on reset processes even after the shipment. However, originally when the memory controller 20 can control such that the bad blocks are not accessed, there is no need to set flags BBF_L and BBF_R in the latch circuits 31a, 31b. Further, the acquired bad blocks are simply controlled by the memory controller 20 so as not to be accessed, and there is no need to set flags BBF_L and BBF_R in the latch circuits 31a, 31b.

EFFECTS OF THE PRESENT EMBODIMENT

According to the present embodiment, the plurality of word lines configuring the U-shaped NAND string is divided into two logical blocks according to the extracting direction of the word lines, and the latch circuits 31a, 31b configured to store the bad block flag (BBF_L and BBF_R) corresponding to the respective logical block are provided. Therefore, flags BBF_L and BBF_R are set in the latch circuits 31a, 31b corresponding to the bad block. Accordingly, for example, even when the physical block on the In side has failed, there are cases in which the physical block on the Out side can be accessed. As a result, it becomes possible to suppress the capacity that becomes incapable of using to ½ of a conventional technique. In the BiCS flash memories using stacked-type memory cells, a minimum unit of the failed block can be made small. As a result, a failure-relief efficiency upon when the failure has occurred can be improved. Because of this, a necessary number of extension blocks can be reduced, and a reduction in a chip area can be expected.

Further, the information on the inherent bad blocks detected in the die sorting test are registered in the ROM fuse region 11a of the memory cell array 11, and are set in the latch circuits 31a, 31b corresponding to the bad blocks after the power-on reset process. Further, the information on the acquired bad block occurred after the shipment is registered in the managed region 11b of the memory cell array 11b, and after the power-on reset process, the bad block is controlled to be unselected based on the bad block address registered in the managed region 11b by the controller 20. Accordingly, the bad blocks can be controlled so as not to be accessed with respect to the inherent failure and the acquired failure.

Second Embodiment

Figure 11:
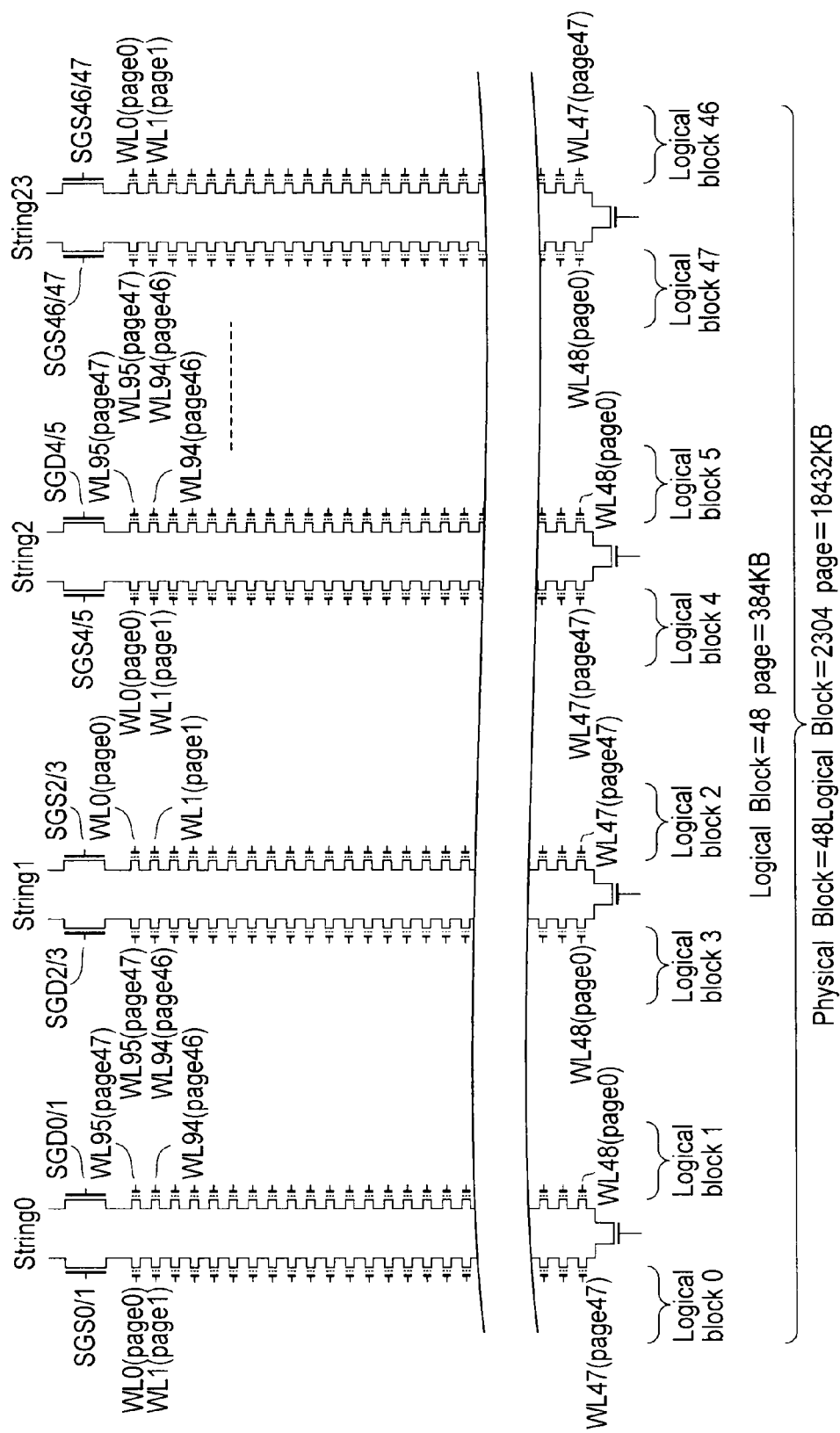
FIG. 11 is a diagram showing a block configuration of a p-BiCS memory in a non-volatile semiconductor memory device of a second embodiment.

FIG. 11 shows a configuration of a memory cell array in a second embodiment.

As shown in FIG. 11, the second embodiment uses a physical block as a unit to share the word lines WL, and half strings are respectively referred to as logical blocks (second logical blocks). For example, word lines WL0 to WL47 of the string 0 is determined as the second logical block 0, and word lines WL48 to WL95 are determined as the second logical block 1. When the second logical block 0 or the second logical block 1 in the string 0 is selected, SGS0/1 is set to be in the selected state. Further, word lines WL0 to WL47 of the string 1 is determined as the second logical block 2, and word lines WL48 to WL95 are determined as the second logical block 3. Similarly, word lines WL0 to WL47 of the string 23 is determined as the second logical block 46, and word lines WL48 to WL95 are determined as the second logical block 47.

By providing the row decoder as shown in FIG. 6, when a writing failure occurs, for example, because of a short circuit of the word lines WL in one page in the first logical block 0, the first logical block 0 having word lines WL0 to WL47 is determined as the bad block. By configuring as above, in regards to the inherent failure, it becomes possible to suppress the capacity that becomes incapable of using to ½ of the conventional technique.

Further, in regards to the acquired failure, a failure table storing information on the bad blocks is generated in the RAM of the memory controller 20 in a unit of the second logical block. Because of this, it becomes possible to unselect in a unit of the half string.

In the example shown in FIG. 11, for example, when a writing failure occurs in one page in the second logical block 0, only the second logical block 0 is determined as a bad block. Because of this, it becomes possible to suppress the capacity that becomes incapable of using to ¹⁄₄₈ of the conventional technique, which is 384 KB.

Accordingly in the second embodiment, it becomes possible to suppress the capacity that becomes incapable of using by the occurrence of a bad block to a level of the planar NAND flash memory.

Further, the relief of the acquired failure can be adapted to the block configuration as shown in FIG. 4.

As shown in FIG. 4, an explanation will be given of a p-BiCS having 48 layers of word lines WL, i.e. having 96 word lines and 24 strings per one block. Further, the number of blocks will be 1024. That is, 1024 instances of the block shown in FIG. 5 are assumed as being provided. Further, one memory cell stores 2 bits of data. The 2 bits are distinguished by a lower page (lower page) address and an upper page (upper page) address.

In this case, 10 bits are necessary for expressing a block address, and 5 bits are necessary for expressing a string address. Further, if a half string address is to be expressed, 6 bits will be required.

Originally, despite the existence of a cell to which a few bits writing cannot be performed, such will not be a problem because a relief therefor is possible by ECC. However, this time, for the sake of simplifying the explanation, it is assumed that the writing fails if there is even a bit to which the writing cannot be performed for 1 bit, and a failed page occurs thereby. The examples of the failed page and measures against the failure thereof will be listed as (1) to (3).

(1) Assume that a writing failure has occurred during a programming of a lower page of a word line WL5 in a string 9 of a block 204. A cause thereof is the writing becoming disabled because one of the cells in this page has physically failed while experiencing repetitions of the writing/erasing and high voltage stress. The failure caused by this memory cell fails the writing of the lower page/upper page selected by word line WL5 of the string 9 including this cell, however, for example, a word line WL5 of a string 10 can be written with no problem. In this case, an address of the string 9 of the block 204 is registered in the managed region 11*b*.

(2) Assume that a writing failure has occurred during a programming of a lower page of a word line WL6 in a string 0 of a block 435. A cause thereof is the writing becoming disabled because word lines WL6 and WL7 have short circuited during use despite having passed the die sorting test. In the failure caused by this driving on the In/Out side, since word lines WL6 and WL7 are short circuited, all of the pages belonging to the word lines in all of the strings (string 0 to string 23) in the block 435 become incapable of being written. In this case, addresses of the string 0 to the string 23 in the block 435 are registered in the managed region 11*b*.

(3) Assume that a writing failure has occurred during a programming of a lower page of a word line WL0 in a string 3 of a block 687. A cause thereof is a polysilicon having been abruptly cut off because of a void in a polysilicon column embedded in the U-shaped string of the cells in this page. In this failure, all of the pages belonging to the string 3 are failed. The writing of other strings, for example, pages belonging to a string 4 has no problem. In this case, address of the string 3 of the block 687 is registered in the managed region 11*b*.

The memory controller 20 reads data in the managed region 11*b* after the completion of the power-on reset process, and transfers to the RAM of the memory controller 20. Thereafter, it is controlled such that the addresses registered in the RAM are not accessed.

According to the above second embodiment, the physical block that is determined by a physical restriction such as an erasing unit can be divided into logical blocks, and it can be dealt as a bad block for each of the logical blocks. Because of this, when a writing failure, etc. occurs, it becomes possible to reduce the area that becomes incapable of being used because of the bad block. Accordingly, the necessary number of extension blocks can be reduced, and the chip area can be reduced.

In the case of the p-BiCS memory, instead of configuring the strings sharing the word lines as one block (which is a unit of replacement upon the occurrence of the failure), by configuring a string unit, or a half-string unit of a p-BiCS memory, i.e. between SGD-pipe and pipe-SGS with different logical blocks, the minimum unit of the failed block can be made small, and the relief efficiency upon the occurrence of the failure can dramatically be improved.

That is, in regards to the acquired failure, the logical blocks can freely be set; for example, as aforementioned, the half string shown in FIG. 11 can be determined as the second logical block, and a management under a word line unit as the minimum unit is also possible. Further, for example, with 4 word lines, etc., a plurality of word lines may be grouped as a logical block, and be managed thereby.

Third Embodiment

Figure 12:
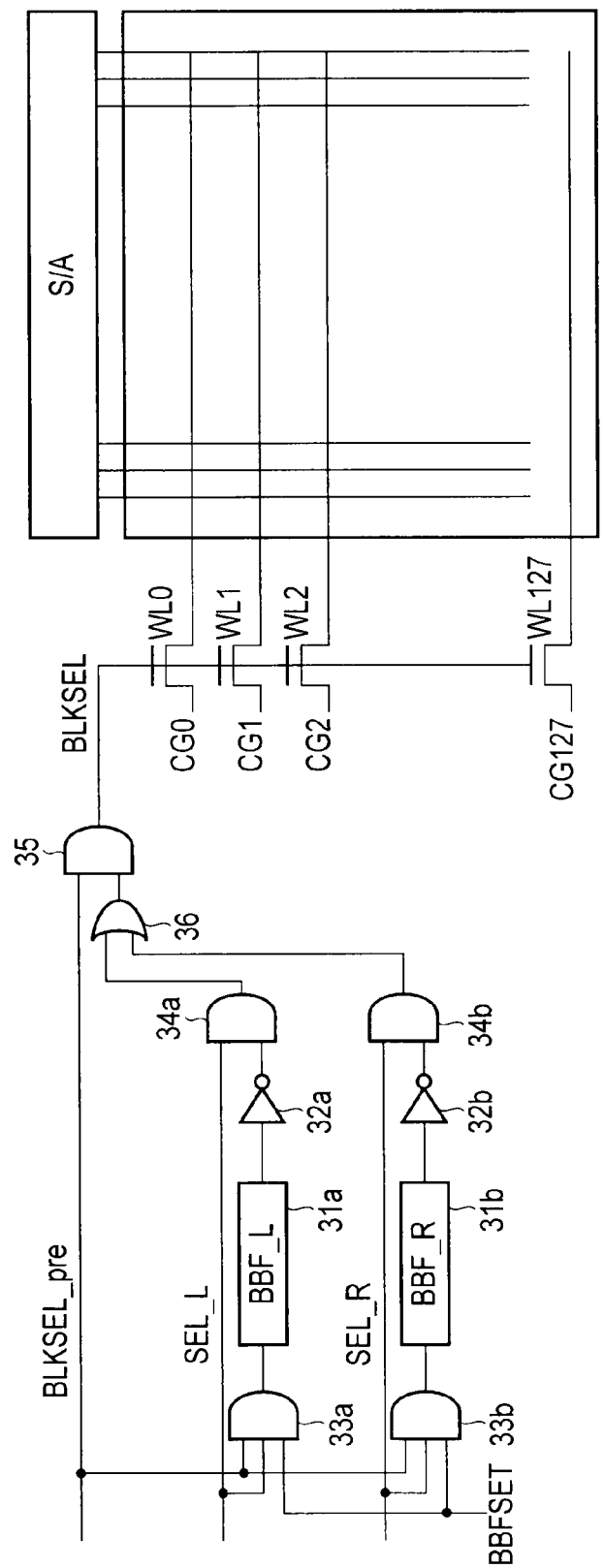
FIG. 12 is a block diagram showing a circuit configuration of a row decoder unit of a non-volatile semiconductor memory device of a third embodiment.

FIG. 12 shows a third embodiment, and is a diagram showing a circuit configuration of a row decoder.

The third embodiment shows an example of adapting the circuit shown in FIG. 6 to a planar NAND flash memory. The configuration of the row decoder itself is substantially identical to FIG. 6, and a typical NAND flash memory is used as the memory. That is, in the first and second embodiments, the plurality of memory cells configuring the NAND string was arranged in the vertical direction relative to the surface of the semiconductor substrate. Contrary to this, in the third embodiment, a plurality of memory cells configuring a NAND string is arranged along a surface of a semiconductor substrate, and word lines WL0 to WL127 are separated into two groups of word lines WL0 to WL63 and word lines WL64 to WL127, as is similar to the first and second embodiments.

In the case of the third embodiment, SEL_L is a signal that is high when word lines WL0 to WL63 are selected, and SEL_R is a signal that is high when word lines WL64 to WL127 are selected. For example, when word lines WL0 and WL1 were short circuited, flag BBF_L (high) is set in a latch circuit 31*a* of this logical block. By configuring as above, for example, when one of word lines WL0 to WL63 is selected in the writing operation, this logical block is brought to the unselected state. Accordingly, word lines WL0 and WL1 being short circuited does not impose any undesirable influence on other components. On the other hand, when word lines WL64 to WL127 in this logical block are selected, this logical block is brought to the selected state.

At this occasion, $V_{PGM}$ is applied to the selected word lines among word lines WL64 to WL127, and voltage corresponding to a boost option such as VISO/VGP is transferred to the word lines in the periphery of the selected word lines. On the other hand, Vpass is transferred to all of word lines WL0 to WL63. Because of this, word lines WL0 and WL1 being short circuited will not be a problem.

That is, even if a short circuit exists between adjacent word lines, word lines arranged at positions apart from this short circuited portion has high possibility of being used with no problem. For example, in a case where word lines WL5 and WL6 are short circuited, word lines WL64 to WL127 can be used without failing them.

According to the third embodiment, in a NAND string configured of a plurality of memory cells being serially connected, even when a short circuit of word lines is occurring, an entirety of the NAND string does not have to be failed, and a half of the NAND string can be used. Accordingly, it becomes possible to suppress a frequency of occurrence of bad blocks.

(Variants)

Note that the present innovation is not limited to the respective embodiments as aforementioned. The configuration of the memory cell array is not necessarily limited to the p-BiCS, and it may be adapted to a stacked memory device in which memory cells are stacked on a semiconductor substrate. Further, the structure of the p-BiCS is not limited by any means to FIG. 1, and a modification may appropriately be made according to a technical specification. Moreover, the configuration of the row decoder is not limited by any means to FIG. 6 or FIG. 12, and a modification may appropriately be made according to the technical specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
   a memory cell array comprising a set of plurality of NAND strings as a physical block, the plurality of NAND strings respectively including a plurality of memory cells and sharing a plurality of word lines respectively connected to the plurality of memory cells; and
   a row decoder configured to drive the plurality of word lines,
   wherein the physical block is divided into a plurality of first logical blocks,
   wherein the row decoder comprises:
   a plurality of latch circuits provided respectively corresponding to the plurality of first logical blocks, the plurality of latch circuits configured to store a flag indicating a failure when the failure exists in the corresponding first logical block; and
   a drive circuit configured to inhibit driving of the word lines belonging to the first logical block when the flag is stored in the latch circuit corresponding to the first logical block to which selected word lines belong, and the drive circuit configured to allow driving of the word lines belonging to the first logical block when the flag is not stored in the latch circuit corresponding to the first logical block to which the selected word lines belong.

2. The device according to claim 1,
   wherein the memory cell array further comprises a first region in which flags indicating failures and corresponding respectively to the plurality of first logical blocks are stored, and
   the flags indicating the failures in the first region are read after a power is turned on, and are set in the latch circuits corresponding respectively to the plurality of first logical blocks.

3. The device according to claim 2, further comprising a controller,
   wherein the first logical blocks are divided into a plurality of second logical blocks, the memory cell array comprises a second region in which flags indicating failures and corresponding respectively to the plurality of second logical blocks can be stored, and
   the controller inhibits selection of the second logical blocks corresponding to the flags indicating failures in the second region.

4. The device according to claim 1,
   wherein the row decoder comprises: a plurality of first logic circuits that sets the flags indicating failures in the plurality of latch circuits based on a selection signal that selects the plurality of first logical blocks and a signal for setting the flags indicating failures; and
   a second logic circuit to which output signals of the plurality of first logic circuits and the selection signal are supplied, and that configures the drive circuit.

5. The device according to claim 1,
   wherein the memory cell array comprises:
   a silicon layer formed in a columnar shape on a semiconductor substrate; a gate insulating film section in which a tunnel insulating film, a charge accumulating layer, and a block insulating film are formed so as to surround a side wall surface of the silicon layer; and
   a stacked structure section formed so as to surround a side wall surface of the gate insulating film section, and in which a plurality of interlayer insulating films and a plurality of control gate electrode layers that is to be the word lines are alternately stacked on the substrate,
   wherein the memory cell is configured by a vertical transistor including the silicon layer, the tunnel insulating film, the charge accumulating layer, the block insulating film and the control gate electrode layers, and
   a NAND string is configured by two adjacent silicon layers being electrically connected at a bottom portion.

6. The device according to claim 5, wherein
   a first group is configured by the word lines connected to the memory cells provided on one of the silicon layers in the NAND string being extracted in a first direction, and a second group is configured by the word lines connected to the memory cells provided on the other of the silicon layers in the NAND string being extracted in a second direction, and the word lines being in the same layer and extending in the same direction are commonly connected.

7. The device according to claim 1,
   wherein each of the plurality of NAND strings includes the first and second logic blocks, the latch circuits includes a first latch circuit and a second latch circuit corresponding to the first and second logic circuits, the drive circuit inhibits, when the flag is retained at least in one of the first and second latch circuits, driving of the first or second logic circuit corresponding to the latch circuit in which the flag is retained.

8. The device according to claim 1,
   wherein the plurality of NAND strings has the plurality of memory cells arranged along a surface of a semiconductor substrate, the plurality of word lines connected to the plurality of memory cells is divided into a plurality of logic circuits,
   the latch circuits includes a same number of latch circuits as the logic circuits, and
   the drive circuit inhibits, when the flag is retained in at least one of the latch circuits, driving the logic circuit corresponding to the at least one latch circuit.

9. The device according to claim 1,
   wherein the flag is set in the latch circuit when the plurality of word lines is short circuited between one another, or writing of the memory cell has failed.

10. The device according to claim 9, further comprising: a fuse region provided in the memory cell array, wherein a stress test is performed by selecting all of the blocks in a state where the flags are set in the latch circuits, and an address of a detected failed block is stored in the fuse region.

11. The device according to claim 10,
    wherein, when the power is turned on, the address stored in the fuse region is read, and a flag is set in a latch circuit corresponding to the address among the plurality of latch circuits.

12. The device according to claim 1, further comprising:
    a first switch group including a plurality of switches connected to a first group of the word lines of the first logical blocks; and a second switch group including a plurality of switches connected to a second group of the word lines of the first logical blocks.

13. The device according to claim 12, wherein,
the plurality of latch circuits includes first and second latch circuits, the first latch circuit stores a first flag which indicates the first group of word lines includes a failure, and the second latch circuit stores a second flag which indicates the second group of word lines includes a failure.

14. The device according to claim 13, wherein,
the drive circuit includes:
a first logic circuit has first and second input terminals and a first output terminal, the first input terminal is supplied with a first select signal for selecting the first switch group, and the second input terminal is connected to the first latch circuit;
a second logic circuit has third and fourth input terminals and a second output terminal, the third input terminal is supplied with a second select signal for selecting the second switch group, and the second input terminal is connected to the first latch circuit;
a third logic circuit has fifth and sixth input terminals and a third output terminal, the fifth input terminal is connected to the first output terminal of the first logic circuit, the sixth input terminal is connected to the second output terminal of the second logic circuit, and the third output terminal is connected to the switches of the first and second switch groups.

15. The device according to claim 1, further comprising a memory controller including a storage region,
wherein when a writing or an erasing is failed, a logical block address which includes a failure is stored in the storage region.

16. The device according to claim 15, wherein
When a power is turned on, the logical block address stored is read from the storage region, and stores the logical block address stored to the first region of the memory cell array,
wherein the logical block address stored in the first region is controlled by the memory controller so as not to be accessed.

17. The device according to claim 16, wherein
the memory controller comprises an error correcting code (ECC) circuit.

* * * * *